(12) United States Patent
Higashi

(10) Patent No.: US 7,508,079 B2
(45) Date of Patent: Mar. 24, 2009

(54) CIRCUIT SUBSTRATE AND METHOD OF MANUFACTURING THE SAME

(75) Inventor: Mitsutoshi Higashi, Nagano (JP)

(73) Assignee: Shinko Electric Industrial Co., Ltd., Nagano-shi (JP)

( * ) Notice: Subject to any disclaimer, the term of this patent is extended or adjusted under 35 U.S.C. 154(b) by 195 days.

(21) Appl. No.: 11/480,525

(22) Filed: Jul. 5, 2006

(65) Prior Publication Data

US 2007/0020914 A1    Jan. 25, 2007

(30) Foreign Application Priority Data

Jul. 19, 2005    (JP)    ............................. 2005-208080

(51) Int. Cl.
*H01L 29/40*    (2006.01)

(52) U.S. Cl. ............... 257/774; 257/776; 257/E21.597; 438/667; 438/668; 29/828; 29/846; 29/852

(58) Field of Classification Search .......... 257/E23.174, 257/774, 776, E21.597; 438/667, 668; 29/828, 29/846, 852

See application file for complete search history.

(56) References Cited

U.S. PATENT DOCUMENTS

| | | | | |
|---|---|---|---|---|
| 5,421,083 A | * | 6/1995 | Suppelsa et al. | ............... 29/852 |
| 5,485,039 A | | 1/1996 | Fujita et al. | |
| 5,502,893 A | * | 4/1996 | Endoh et al. | ................... 29/852 |
| 5,587,119 A | | 12/1996 | White | ......................... 264/104 |
| 6,353,999 B1 | * | 3/2002 | Cheng | ......................... 29/852 |
| 6,717,071 B2 | | 4/2004 | Chang et al. | |
| 6,963,483 B2 | * | 11/2005 | Chakravorty et al. | ...... 361/306.3 |
| 2005/0146049 A1 | * | 7/2005 | Kripesh et al. | .............. 257/776 |

FOREIGN PATENT DOCUMENTS

| | | |
|---|---|---|
| EP | 1 489 658 A2 | 12/2004 |
| JP | 5-183019 | 7/1993 |
| JP | 2001-352166 | 12/2001 |
| JP | 2004-311574 | 11/2004 |

OTHER PUBLICATIONS

European Search Report dated Nov. 3, 2006.

* cited by examiner

*Primary Examiner*—Ha Tran T Nguyen
*Assistant Examiner*—Daniel Whalen
(74) *Attorney, Agent, or Firm*—Kratz, Quintos & Hanson, LLP

(57) ABSTRACT

In a method of manufacturing a circuit substrate of the present invention, a first through hole is formed in a semiconductor substrate and a first insulating layer is formed on the entire surface of the semiconductor substrate, and then first wiring layers connected to each other via an outer through conducting portion provided on the inner surface of the first through hole are formed on both sides of the semiconductor substrate, and then a second insulating layer is formed which covers the first wiring layers on both sides of the semiconductor substrate and the outer through conducting portion on the inner surface of the first through hole, the second insulating layer has a structure in which a second through hole is provided in a central portion of the first through hole, and then second wiring layers connected to each other via an inner through conducting portion provided in the second through hole are formed on the second insulating layer on both sides of the semiconductor substrate.

2 Claims, 9 Drawing Sheets

CIRCUIT SUBSTRATE AND METHOD OF MANUFACTURING THE SAME

CROSS-REFERENCE TO RELATED APPLICATIONS

This application is based on and claims priority of Japanese Patent Application No.2005-208080 filed on Jul. 19, 2005, the entire contents of which are incorporated herein by reference.

BACKGROUND OF THE INVENTION

1. Field of the Invention

The present invention relates to a circuit substrate and a method of manufacturing the same. More specifically, the present invention relates to a circuit substrate having a structure which enables conduction between the two sides of a substrate via a conductor in a through hole provided in the substrate, and relates to a method of manufacturing the same.

2. Description of the Related Art

Heretofore, there are circuit substrates having a structure in which wiring layers formed on both sides of a silicon substrate are connected to each other through conductors provided in through holes of the silicon substrate.

A method of manufacturing such a circuit substrate will be described. As shown in FIG. 1, first, through holes 100x are formed in a silicon substrate 100, and then the silicon substrate 100 is thermally oxidized, whereby a first insulating layer 110 is formed on both surfaces of the silicon substrate 100 and the inner surfaces of the through holes 100x. Subsequently, wiring layers 130 connected to each other via through electrodes 120 in the through holes 100x are formed on both sides of the silicon substrate 100 by a semi-additive process or the like. Moreover, a second insulating layer 140 having opening portions 140a provided on pad portions of the wiring layer 130 is formed on each side of the silicon substrate 100. A thing similar to this circuit substrate is described in Patent Literature 1 (Japanese Unexamined Patent Publication No. 2004-311574).

Moreover, there is a circuit substrate in which conduction between the two sides of a substrate is made possible by inserting conductive components into through holes provided in the substrate. It is described in Patent literature 2 (Japanese Unexamined Patent Publication No. 2001-352166) that a coaxial line structure which enables conduction between the two sides of a core substrate is formed by forming a conductor layer on the inner walls of through holes of the core substrate and then inserting through hole components having a structure in which a core wire is covered with resin into the through holes.

Furthermore, it is described in Patent Literature 3 (Japanese Unexamined Patent Publication No. Hei 5-183019) that a semiconductor device having a structure in which conductive pins are inserted in through holes of a semiconductor substrate, and upper portions of the conductive pins are connected to wiring on the upper side of the semiconductor substrate, and lower portions of the conductive pins are used as external connection terminals.

Furthermore, it is described in Patent Literature 4 (U.S. Pat. No. 6,717,071 B2) that a coaxial via hole structure in which outer and inner cylindrical conductors and an insulator filling the space in between are formed in a through hole of a substrate.

In recent years, there has been a demand for a wiring substrate having a structure in which two conducting paths electrically insulated from each other are formed in a through hole of a substrate, and one conducting path is connected to a first wiring layer on the substrate, and the other conducting path is connected to a second wiring layer on the substrate.

However, in the prior art, since one conducting path is formed in a through hole of a substrate, the number of through holes becomes large in the case where both sides of the substrate are connected to each other by two independent conducting paths. Thus, there is a problem that a wiring layout is limited.

Also, in Patent Literature 2 (Japanese Unexamined Patent Publication No. 2001-352166), two independent conducting paths can be formed in a through hole of a resin substrate. However, since this is a method in which conductive components are inserted into a through hole, it is very difficult to apply this method to fine through holes provided in a semiconductor substrate having a reduced thickness.

On the other hand, in Patent Literature 4 (U.S. Pat. No. 6,717,071 B2), a method is disclosed in which a coaxial capacitor or the like is formed in a through hole of a substrate, but no consideration is given to enabling conduction between the two sides of the substrate.

SUMMARY OF THE INVENTION

An object of the present invention is to provide a circuit substrate in which two independent, highly-reliable conducting paths are formed in a through hole of a substrate to enable conduction between the two sides of the substrate without causing any problems, and to provide a method of manufacturing the same.

The present invention relates to a method of manufacturing a circuit substrate. The method includes the steps of: forming in a semiconductor substrate a first through hole penetrating the semiconductor substrate in a thickness direction; forming a first insulating layer on both surfaces of the semiconductor substrate and on an inner surface of the first through hole; forming a first wiring layer on the first insulating layer on each side of the semiconductor substrate, the first wiring layers being connected to each other via an outer through conducting portion provided on the inner surface of the first through hole; forming a second insulating layer covering the first wiring layers on both sides of the semiconductor substrate and the outer through conducting portion on the inner surface of the first through hole, the second insulating layer having a structure in which a second through hole is provided in a central portion of the first through hole; and forming a second wiring layer on the second insulating layer on each side of the semiconductor substrate, the second wiring layers being connected to each other via an inner through conducting portion formed in the second through hole.

In the present invention, first, the through hole is formed in the semiconductor substrate (such as a silicon substrate having a reduced thickness), and then the first insulating layer is formed on the entire surface of the semiconductor substrate including the inner surface of the through hole. Subsequently, the first wiring layers connected to each other via the outer through conducting portion formed on the inner surface of the first through hole are formed on both sides of the semiconductor substrate. Moreover, the second insulating layer is formed which covers the first wiring layers on both sides of the semiconductor substrate and the outer through conducting portion on the inner surface of the first through hole. The second insulating layer has a structure in which the second through hole is provided in the central portion of the first through hole. Then, the second wiring layers connected to each other via the inner through conducting portion filling the second through hole are formed on the second insulating layers on both sides of the semiconductor substrate, respectively.

Thus, in the present invention, the outer and inner through conducting portions constituting a coaxial structure are formed in one through hole of the semiconductor substrate in a state in which the outer and inner through conducting portions are insulated from each other by the second insulating layer. Accordingly, unlike the prior art, two independent conducting paths which enable conduction between the two sides of the semiconductor substrate can be easily formed without unnecessarily increasing the number of through holes and without limiting a wiring layout.

In one preferred mode of the present invention, in the step of forming the second insulating layer having a structure in which the second through hole is provided, an inorganic insulating layer covering the first wiring layers on both sides of the semiconductor substrate and the outer through conducting portion on the inner surface of the first through hole is formed by CVD to have such a thickness that a hole is left in the first through hole, and the hole is used as the second through hole.

By doing so, when the second insulating layer is formed, the second through hole is thereby also formed simultaneously. Accordingly, the step of forming the second through hole becomes unnecessary. Thus, cost can be reduced compared to that of a method in which an opening is formed in an insulating layer using a laser, and it is possible to easily cope with the case where the first through hole becomes smaller.

As described above, in the present invention, two fine conducting paths can be easily formed in a through hole of a semiconductor substrate without causing any problems.

DESCRIPTION OF THE PREFERRED EMBODIMENTS

Hereinafter, embodiments of the present invention will be described with reference to accompanying drawings.

First Embodiment

Figure 3:
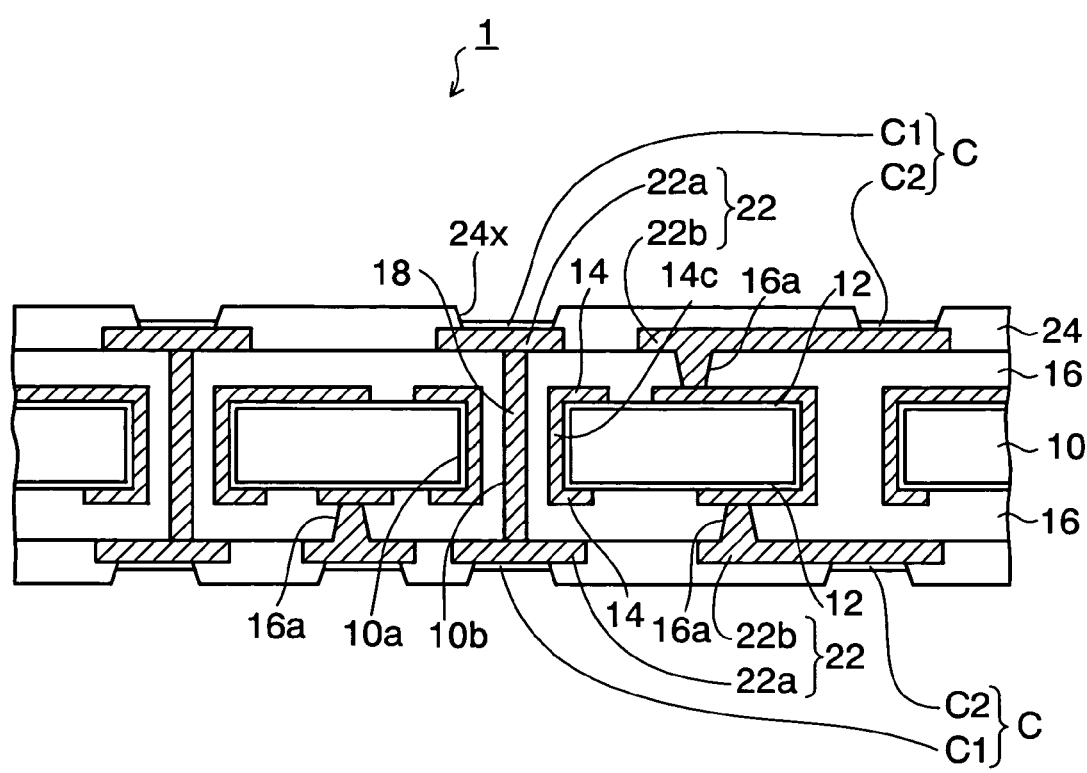
FIG. 3 is a cross-sectional view showing the circuit substrate of the first embodiment of the present invention.
Figure 4A:
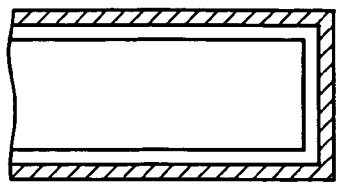
FIGS. 4A to 4D are cross-sectional views for explaining details of the step of FIG. 2C.
Figure 4A:
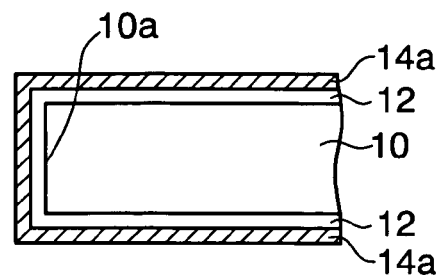
Figure 4B:
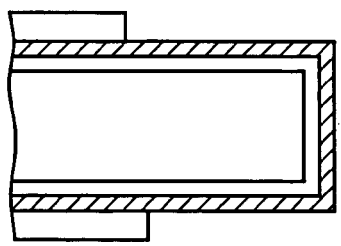
Figure 4B:
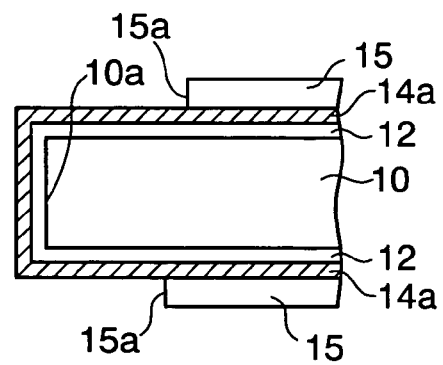
Figure 4C:
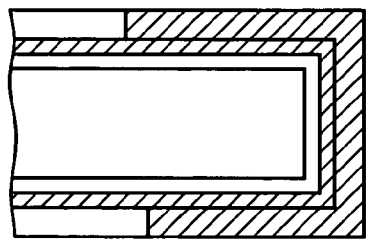
Figure 4C:
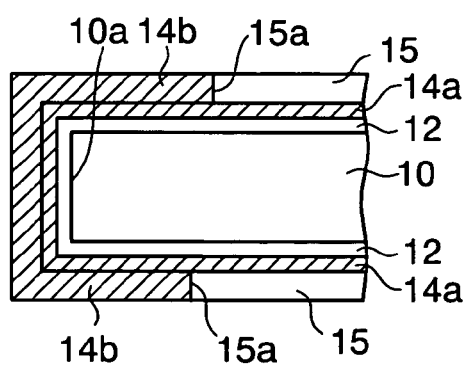
Figure 4D:
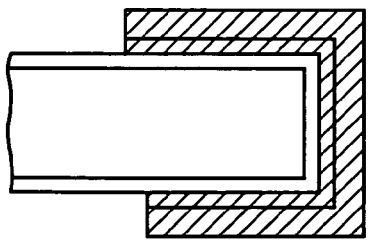
Figure 4D:
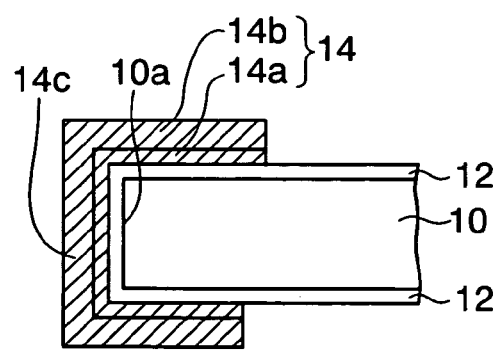
Figure 5A:
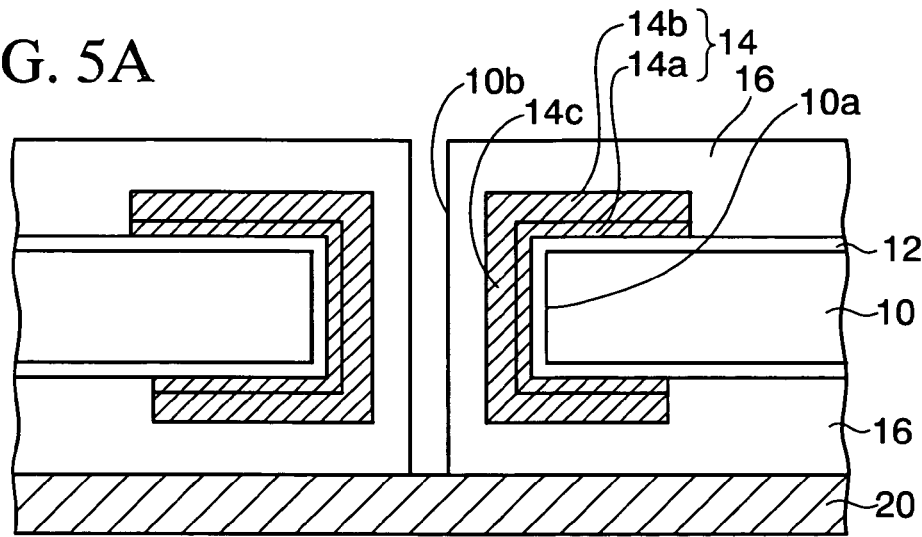
FIGS. 5A to 5C are cross-sectional views for explaining details of the step of FIG. 2F.
Figure 5B:
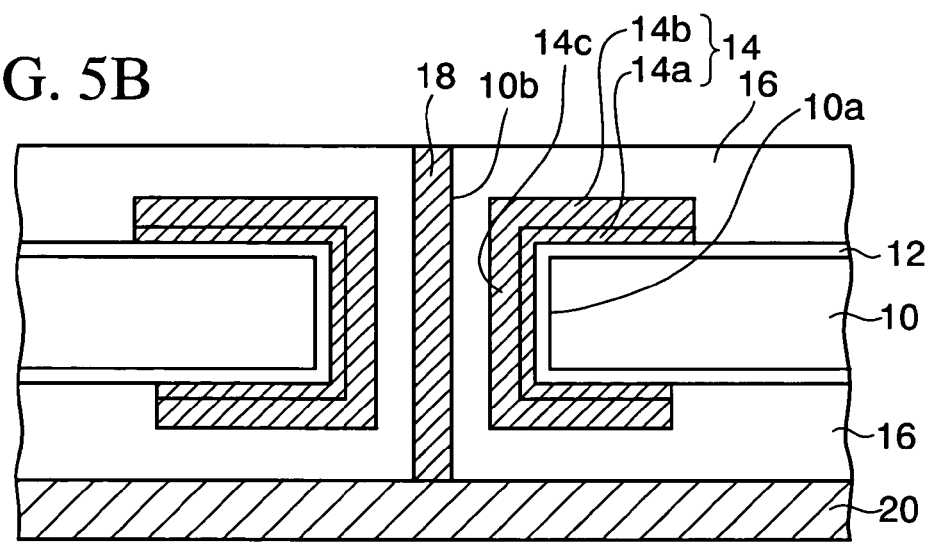
Figure 5C:
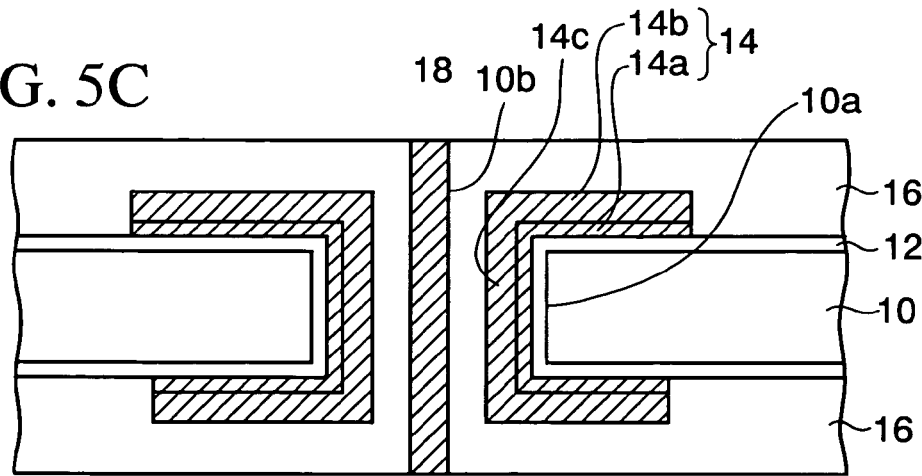

FIGS. 2A to 2I are cross-sectional views showing a method of manufacturing a circuit substrate of a first embodiment of the present invention. FIG. 3 is a cross-sectional view showing the circuit substrate of the first embodiment. FIGS. 4A to 4D are cross-sectional views showing details of the step of FIG. 2C. FIGS. 5A to 5C are cross-sectional views showing details of the step of FIG. 2F.

Figure 1:
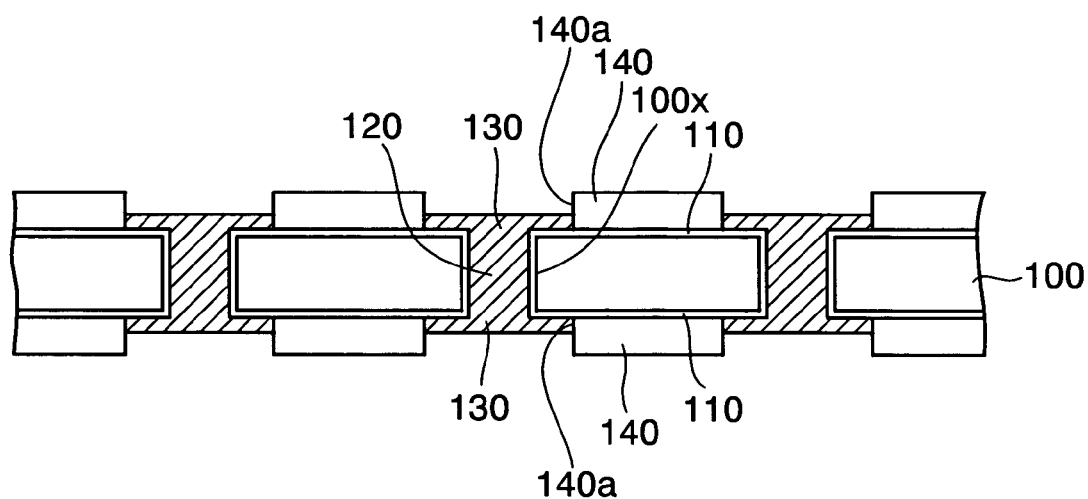
FIG. 1 is a cross-sectional view showing a circuit substrate of the prior art.
Figure 2A:
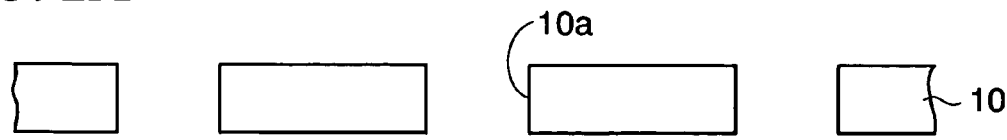
FIGS. 2A to 2I are cross-sectional views showing a method of manufacturing a circuit substrate of a first embodiment of the present invention.

First, as shown in FIG. 2A, a silicon substrate 10 is prepared as a semiconductor substrate, and first through holes 10a are formed which penetrate the silicon substrate 10 in the thickness direction thereof. As a method of forming the first through holes 10a, a method is employed in which a mask (not shown) having opening portions provided therein is formed on the silicon substrate 10 and in which the silicon substrate 10 is etched by RIE through the opening portions of the mask. In this embodiment, since the silicon substrate 10 thickness of which is reduced to 50 to 300 μm (preferably 100 to 200 μm) is used, fine first through holes 10a each having a diameter of 60 μm or less (preferably 30 to 60 μm) can be formed.

Figure 2B:
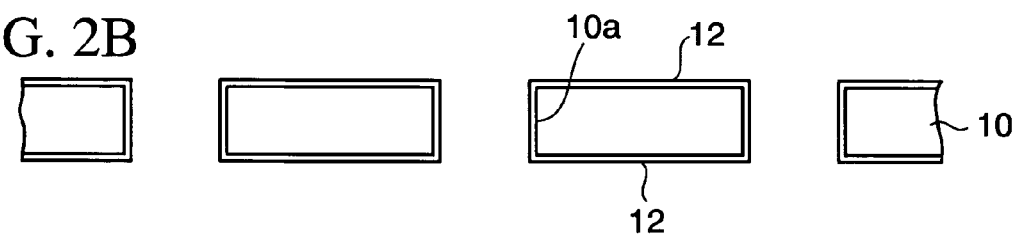

Subsequently, as shown in FIG. 2B, the silicon substrate 10 is thermally oxidized, whereby a first insulating layer 12 made of a silicon oxide layer is formed on both surfaces of the silicon substrate 10 and the inner surfaces of the first through holes 10a. Alternatively, a silicon oxide layer, a silicon nitride layer, or the like may be formed by CVD on both surfaces of the silicon substrate 10 and the inner surfaces of the first through holes 10a to be used as the first insulating layer 12.

Figure 2C:
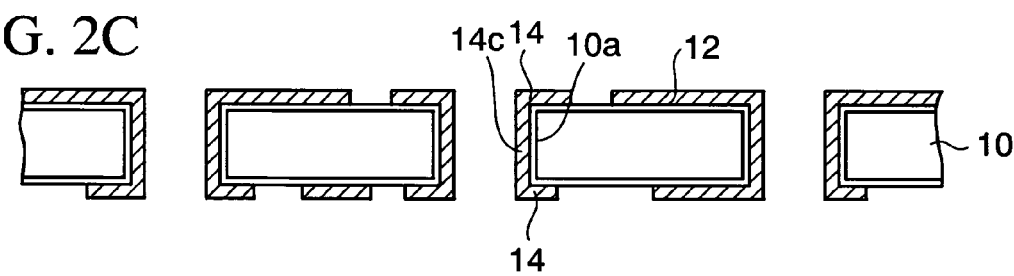

Then, as shown in FIG. 2C, first wiring layers 14 are formed which extend from the inner surfaces of the first through holes 10a of the silicon substrate 10 to both sides of the silicon substrate 10. A method of forming the first wiring layers 14 will be described in detail. First, as shown in FIG. 4A, a seed layer 14a made of copper (Cu) or the like is formed by sputtering or electroless plating on the first insulating layer 12 on both surfaces of the silicon substrate 10 and on the inner surfaces of the first through holes 10a. Then, as shown in FIG. 4B, resist films 15 having opening portions 15a provided in portions where the first wiring layers are formed are formed on both sides of the silicon substrate 10. Moreover, as shown in FIG. 4C, by electroplating using the seed layer 14a as a plating power-supplying layer, a metal layer 14b made of copper (Cu) or the like is formed on the seed layer 14a in the opening portions 15a of the resist films 15a and on the inner surfaces of the first through holes 10a which communicate with the opening portions 15a. Moreover, as shown in FIG. 4D, the resist films 15 are removed, and then the seed layer 14a is etched using the metal layer 14b as a mask. Thus, the first wiring layers 14 composed of the seed layer 14a and the metal layer 14b are obtained.

In this way, as shown in FIG. 2C, the first wiring layers 14 are formed to include outer through conducting portions 14c provided on the inner surfaces of the first through holes 10a of the silicon substrate 10, and the first wiring layers 14 on both sides of the silicon substrate 10 are formed in a state in which they are connected to each other via the outer through conducting portions 14c. At the time when the first wiring layers 14 are formed, holes are left in the first through holes 10a. In this embodiment, the first wiring layers 14 function as first ground layers.

In the above-described embodiment, a method in which the first wiring layers 14 are formed by a semi-additive process is exemplified, but various kinds of wiring forming methods can be employed.

Figure 2D:
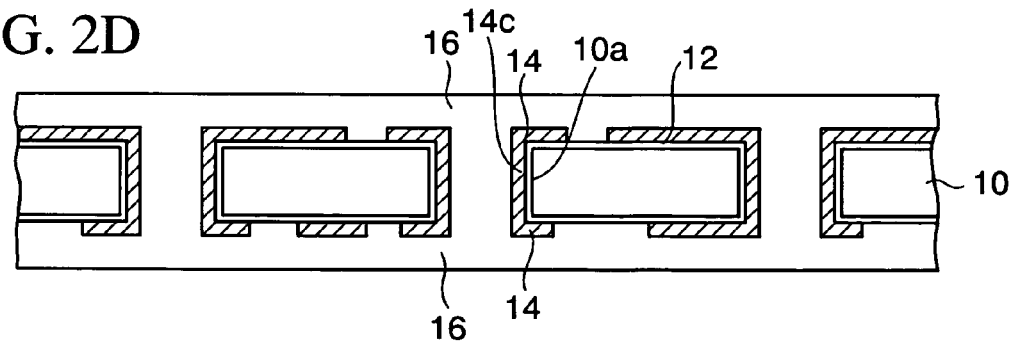

Next, as shown in FIG. 2D, a second insulating layer 16 filling the first through holes 10a is formed on both sides of the silicon substrate 10 by attaching a resin sheet on the first wiring layers 14 on each side of the silicon substrate 10 and hardening the resin sheets fluidized by heat treatment. The second insulating layer 16 is formed in a state in which the top surfaces thereof are planarized on both sides of the silicon substrate 10. It should be noted that the second insulating layer 16 may be formed on both sides of the silicon substrate 10 by coating or printing liquid resin.

Figure 2E:
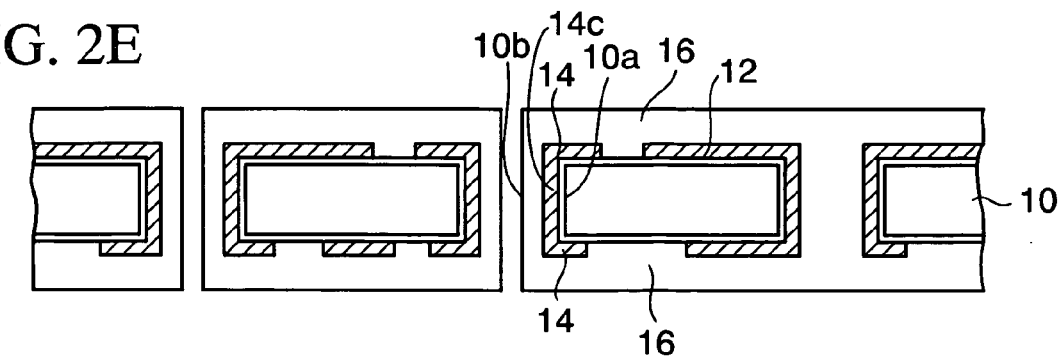

Subsequently, as shown in FIG. 2E, second through holes 10b are formed by processing central portions of the second insulating layer 16 filling the first through holes 10a of the silicon substrate 10 by means of a laser or the like. Thus, the second insulating layer 16 is left in a ring shape on (the lateral direction in FIG. 2E) the outer through conducting portions 14c provided on the inner surfaces of the first through holes 10a. In the first embodiment, second through holes lob can be formed in the second insulating layer 16 in arbitrary first through holes 10a of the plurality of first through holes 10a.

Figure 2F:
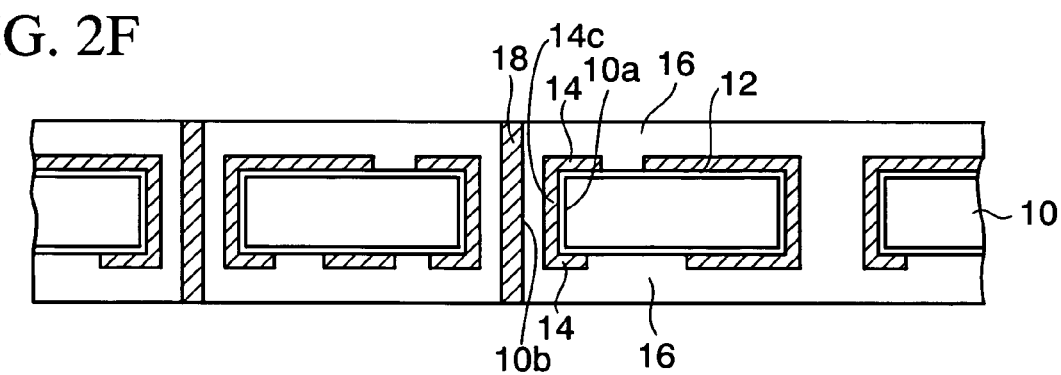

Then, as shown in FIG. 2F, inner through conducting portions 18 are formed in the second through holes 10b. A forming method will be described in detail. First, as shown in FIG. 5A, the structure of FIG. 2E is placed on and bonded to a plating power-supplying material 20 made of copper foil or the like. Next, as shown in FIG. 5B, by electroplating using the plating power-supplying material 20 as a power-supplying path, the second through holes 10b are filled with copper (Cu) or the like from lower portions thereof to upper portions thereof to form the inner through conducting portions 18. Subsequently, as shown in FIG. 5C, the plating power-supplying material 20 is removed.

In this way, as shown in FIG. 2F, the inner through conducting portions 18 can be formed in the second through holes 10b provided inside the first through holes 10a. The outer through conducting portions 14c and the inner through conducting portions 18 are formed in a state in which they are electrically insulated from each other by the second insulating layer 16 filling the spaces in between.

Figure 2G:
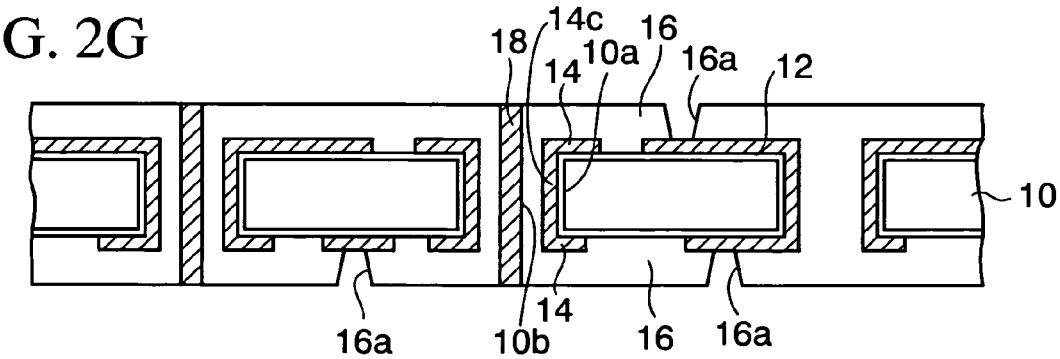

Next, as shown in FIG. 2G, predetermined portions of the second insulating layer 16 on the first wiring layers 14 on each side of the silicon substrate 10 are processed by means of a laser or the like, thus via holes 16a having depths that reach the first wiring layers 14 are formed respectively.

Figure 2H:
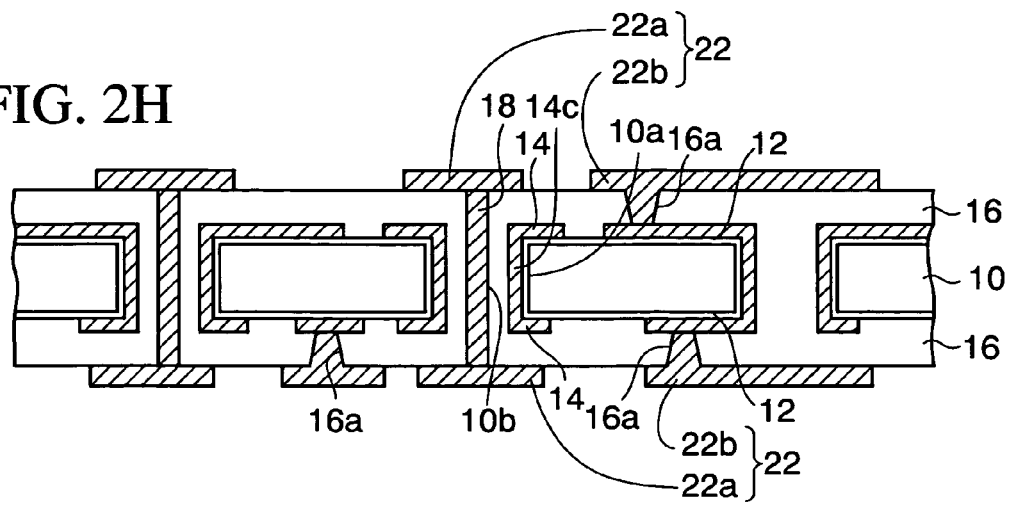

Then, as shown in FIG. 2H, second wiring layers 22 are formed on the second insulating layer 16 on each side of the silicon substrate 10. On each side of the silicon substrate 10, the second wiring layers 22 are formed to include signal layers 22a electrically connected to the inner through conducting portions 18 in the second through holes 10b, and second ground layers 22b connected to the first wiring layers 14 (first ground layers) via the via holes 16a. The second wiring layers 22 are formed by a semi-additive process or the like as in the aforementioned method of forming the first wiring layers 14. It should be noted that though the inner through conducting portions 18 in the second through holes 18b and the second wiring layers 22 connected thereto are formed in different steps in the above-described embodiment, the inner through conducting portions 18 and the second wiring layers 22 may be formed simultaneously by a semi-additive process.

By the above-described method, the outer through conducting portions 14c are formed on the inner surfaces of the first through holes 10a provided in the silicon substrate 10, and the first wiring layers 14 connected to each other via the outer through conducting portions 14c are respectively formed on the first insulating layer 12 on both sides of the silicon substrate 10. Moreover, the inner through conducting portions 18 are formed in the second through holes 10b provided in the central portions of the second insulating layer 16 filling the first through holes 10a, and the second wiring layers 22 connected to each other via the inner through conducting portions 18 are respectively formed on the second insulating layer 16 on both sides of the silicon substrate 10. The outer through conducting portions 14c and the inner through conducting portions 18 are electrically insulated from each other by the second insulating layer 16 filling the spaces in between.

In this way, two independent conducting paths (outer and inner through conducting portions 14c and 18) which enable conduction between the two sides of the silicon substrate 10 can be easily formed in an arbitrary through hole of the plurality of first through holes 10a provided in the silicon substrate 10.

Figure 2I:
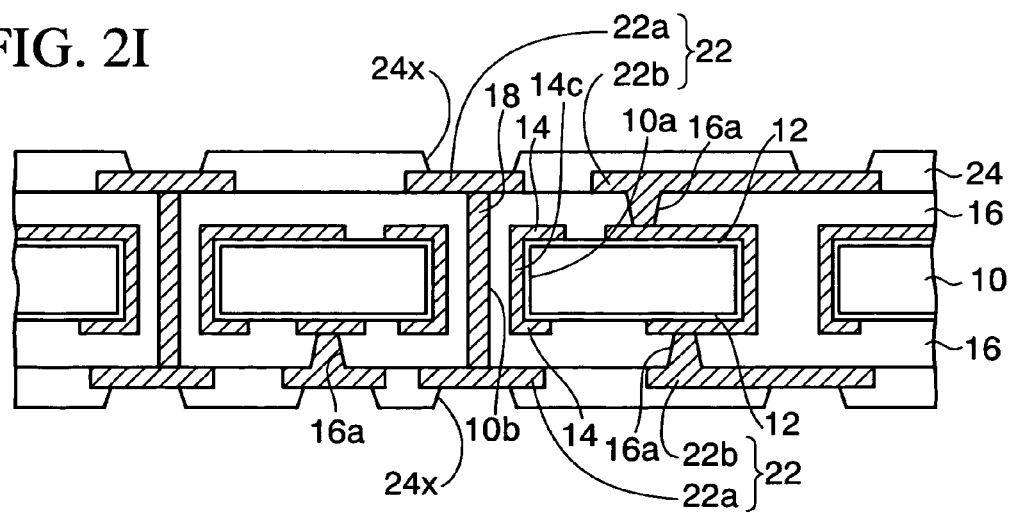

Next, as shown in FIG. 2I, a solder resist film 24 having opening portions 24x provided on the second wiring layers 22 is formed on each side of the silicon substrate 10. Then, as shown in FIG. 3, connecting portions C are formed by performing Ni/Au plating on portions of the second wiring layers 22 in the opening portions 24x of the solder resist film 24. On each side of the silicon substrate 10, the connecting portions C are formed to include connecting portions C1 for signal and connecting portions C2 for ground.

Thus, a circuit substrate 1 of this embodiment is obtained. In above-described embodiment, a mode in which two wiring layers are provided on each side of the silicon substrate 10 is exemplified, but n layers (n is an integer of two or more) of multilayered wiring may be formed on each side.

Though not particularly shown, the circuit substrate 1 of this embodiment is used as a silicon interposer, an electronic parts such as a semiconductor device is mounted on the uppermost wiring layer on one side of the silicon substrate 10, and external connecting terminals are provided on the uppermost wiring layer on the other side of the silicon substrate 10 by mounting solder balls thereon.

In the circuit substrate 1 of this embodiment, as shown in FIG. 3, the first through holes 10a are provided in the silicon substrate 10, and the first insulating layer 12 is formed on the entire surface of the silicon substrate 10 including the inner surfaces of the first through holes 10a. The first wiring layers 14 (first ground layers) are respectively formed on both sides of the silicon substrate 10, and the first wiring layers 14 on the two sides are connected to each other via the outer through conducting portions 14c provided on the inner surfaces of the first through holes 10a.

Moreover, the second insulating layer 16 is formed on the first wiring layers 14 on both sides of the silicon substrate 10 respectively. The second insulating layer 16 is further formed in the first through holes 10a in a state in which it covers the outer through conducting portions 14c on the inner surfaces of the first through holes 10a. In portions of the second insulating layer 16 in the central portions of the first through holes, the second through holes 10b are provided. The second through holes 10b are formed in straight shapes in which the inner surfaces thereof become an identical single surface. Moreover, the second through holes lob are filled with the inner through conducting portions 18. Thus, the inner through conducting portions 18 and the outer through conducting portions 14c are electrically insulated from each other by the second insulating layer 16.

Furthermore, the second wiring layers 22 are respectively formed on the second insulating layer 16 on both sides of the silicon substrate 10. The second wiring layers 22 are formed to include the signal layers 22a connected to the inner through conducting portions 18 and the second ground layers 22b connected to the first wiring layers 14 (first ground layers) via the via holes 16a of the second insulating layer 16. Moreover, the solder resist films 24 having the opening portions 24x provided on the second wiring layers 22 are formed on both sides of the silicon substrate 10, and the connecting portions C are respectively provided in portions of the second wiring layers 22 in the opening portions 24x.

As described above, in the circuit substrate 1 of this embodiment, a structure is employed in which a coaxial conducting path including the outer through conducting portion 14c and the inner through conducting portion 18 insulated from each other by the second insulating layer 16 is formed in one through hole 10a of the silicon substrate 10. Accordingly, unlike the prior art, two independent conducting paths which enable conduction between the two sides of the silicon substrate 10 can be easily formed without unnecessarily increasing the number of through holes and without limiting a wiring layout. Moreover, unlike a method in which conductive components are inserted into a through hole, two conducting paths are formed by building them into a through hole by plating. Thus, two independent conducting paths can be easily formed in a fine through hole (e.g., having a diameter of 60 μm or less).

Second Embodiment

FIGS. 6A to 6G are cross-sectional views showing a method of manufacturing a circuit substrate of a second embodiment of the present invention.

The second embodiment differs from the first embodiment in that the second insulating layer 16 which covers the outer through conducting portions 14c on the inner surfaces of the first through holes 10a is formed by CVD. In the second embodiment, steps similar to those of the first embodiment will not be described in detail.

Figure 6A:
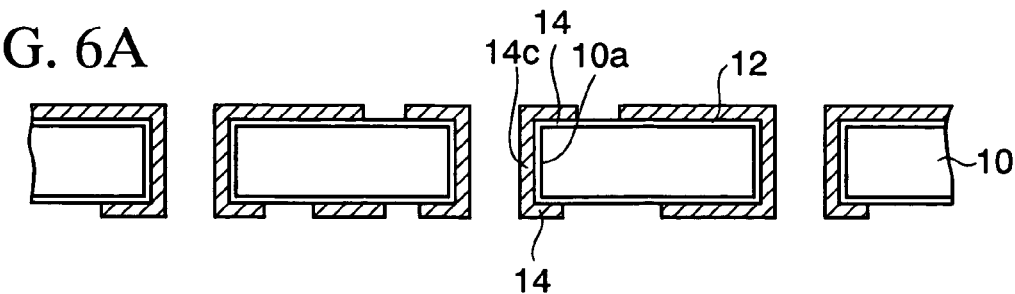
FIGS. 6A to 6G are cross-sectional views showing a method of manufacturing a circuit substrate of a second embodiment of the present invention.
Figure 6B:
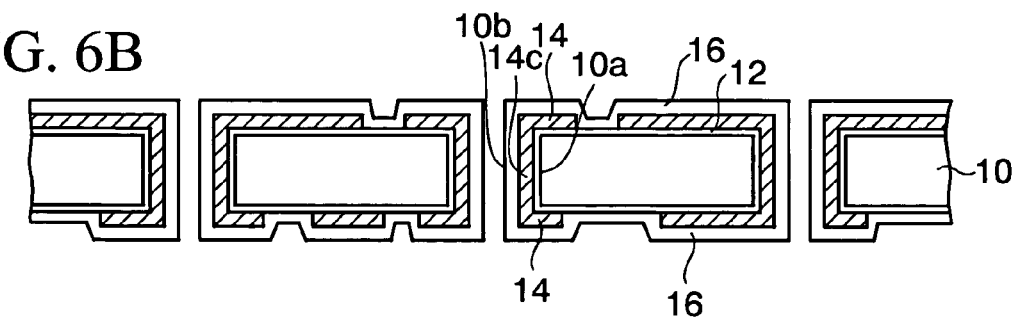

First, as shown in FIG. 6A, the same structure as in FIG. 2C is formed by a method similar to that of the first embodiment. That is, the first wiring layers 14 connected to each other via the outer through conducting portions 14c on the inner surfaces of the first through holes 10a are respectively formed on both sides of the silicon substrate 10. Then, as shown in FIG. 6B, the second insulating layer 16 is formed on the first wiring layers 14 on both sides of the silicon substrate 10 and the outer through conducting portions 14c on the inner surfaces of the first through holes 10a. In the second embodiment, as the second insulating layer 16, an inorganic insulating layer such as a silicon oxide layer or a silicon nitride layer is formed by low-temperature CVD at a deposition temperature of 150° C. or less (80 to 150° C.). In the second embodiment, since the second insulating layer 16 (inorganic insulating layer) having a film thickness of, e.g., approximately 1 μm is formed by low-temperature CVD which provides good step coverage, the second insulating layer 16 which covers the outer through conducting portions 14c can be formed in the first through holes 10a such that holes are left in the central portions thereof. The holes left in the first through holes 10a are used as the second through holes 10b.

As described above, in the second embodiment, the second insulating layer 16 is formed by CVD. Accordingly, the second insulating layer 16 can be formed so that the first through holes 10a are not fully filled but with holes being left therein, therefore the holes which are left there can be utilized as the second through holes 10b. Thus, compared to the process of a method, as in the first embodiment, in which the second through holes 10b are formed by fully filling the first through holes 10a with resin and then processing the resin by means of a laser, the process can be simplified. Also, an inorganic insulating film formed by low-temperature CVD has sufficient electrical insulation properties even if it has a film thickness of 1 μm or less. Accordingly, even in the case where the diameters of the first through holes 10a become smaller, the second through holes 10b can be formed in a self-aligning manner by forming the second insulating layer 16 on the inner surfaces of the first through holes 10a.

Figure 6C:
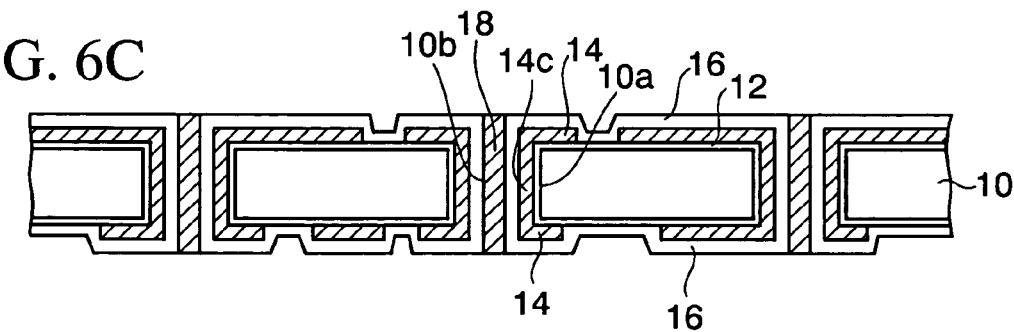

Next, as shown in FIG. 6C, the second through holes 10b are filled with the inner through conducting portions 18 by a method similar to that of the step of FIG. 2F as in the first embodiment, thus forming the inner through conducting portions 18.

Figure 6D:
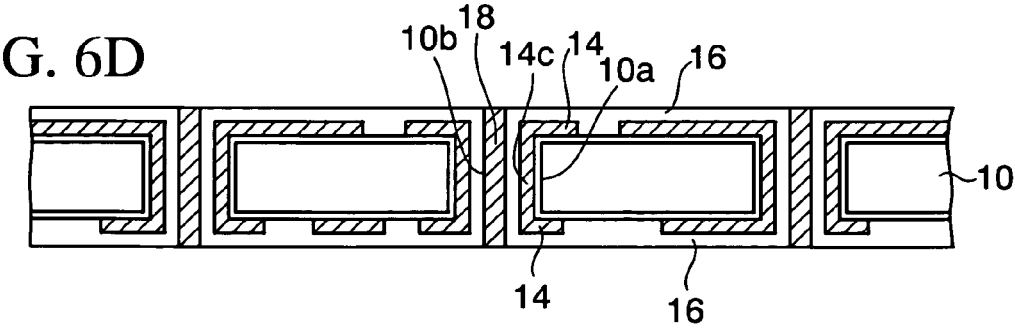

It should be noted that in this embodiment, since a thin inorganic insulating layer is used as the second insulating layer 16, there are cases where level differences of the first wiring layers 14 are left. Accordingly, in the case where there is a possibility that the level differences of the first wiring layers 14 may have an adverse effect on later processes, the level differences of the first wiring layers 14 are planarized as shown in FIG. 6D by forming resin layers (not shown) on both sides of the silicon substrate 10 and polishing the resin layers until the upper and lower surfaces of the inner through conducting portions 18 are exposed.

Figure 6E:
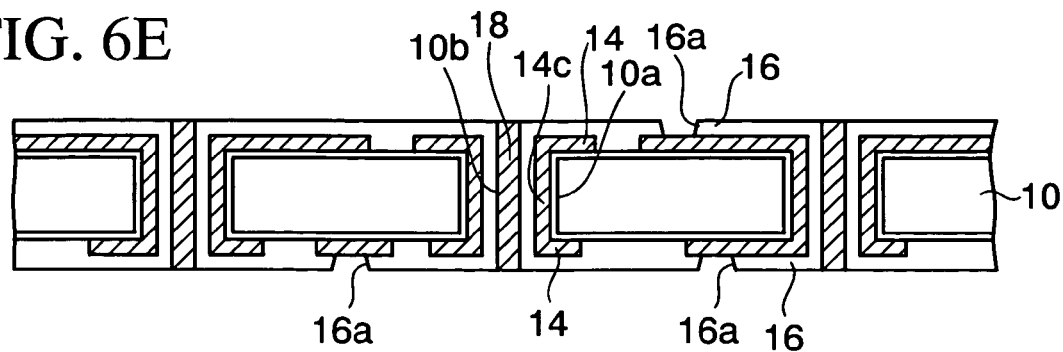

Next, as shown in FIG. 6E, the via holes 16a are formed in portions of the second insulating layer 16 on the first wiring layers 14 on both sides of the silicon substrate 10 as in the first embodiment.

Figure 6F:
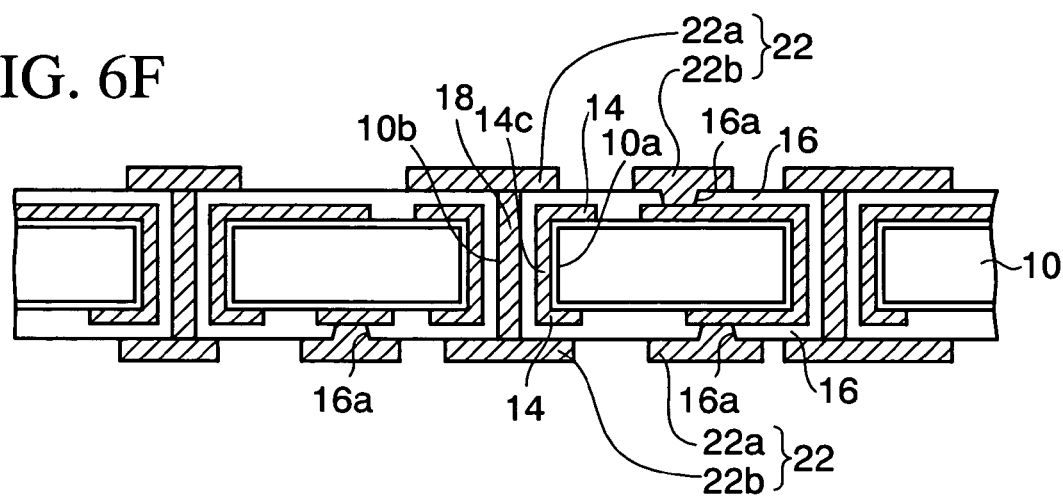

Then, as shown in FIG. 6F, the second wiring layers 22 are respectively formed on both sides of the silicon substrate 10. As in the first embodiment, the second wiring layers 22 are formed to include the signal layers 22a electrically connected to the inner through conducting portions 18 and the second ground layers 22b connected to the first wiring layers 14 (first ground layers) via the via holes 16a.

Figure 6G:
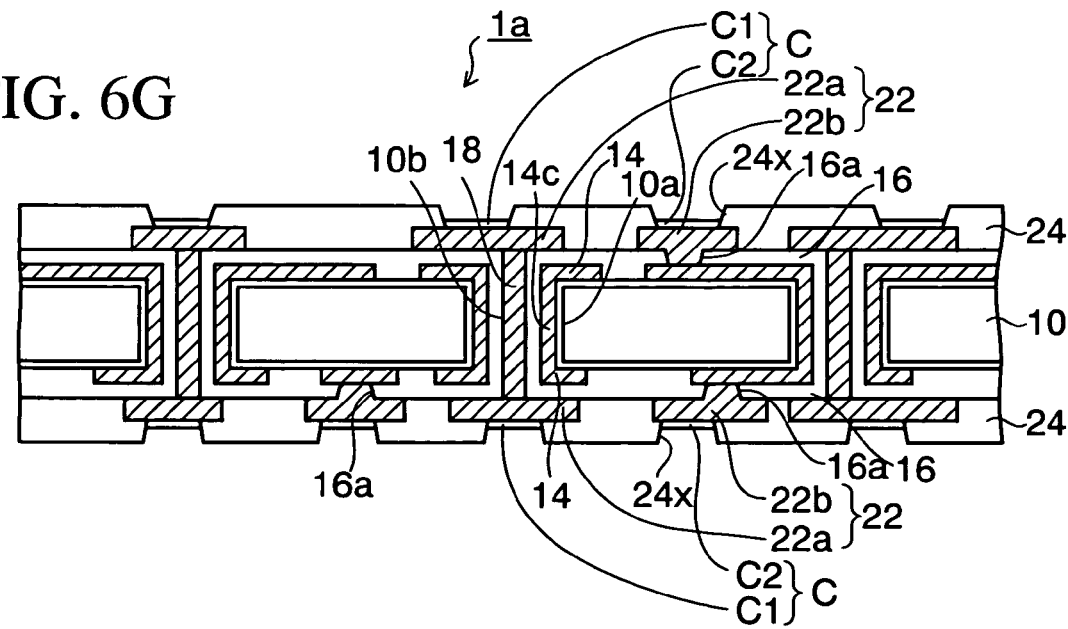

Subsequently, as shown in FIG. 6G, the solder resist films 24 having the opening portions 24x provided on the second wiring layers 22 are formed on both sides of the silicon substrate 10, and then the connecting portions C are formed in portions of the second wiring layers 22 in the opening portions 24x, as in the first embodiment.

By the above-described process, a circuit substrate 1a of the second embodiment is obtained.

In the second embodiment, as in the first embodiment, a mode may also be employed in which n layers (n is an integer of two or more) of multilayered wiring are formed on each side of the silicon substrate 10.

The second embodiment has similar effects to those of the first embodiment. Moreover, in the second embodiment, a thin inorganic insulating layer formed by CVD is used as the second insulating layer 16 for electrically insulating the outer through conducting portions 14c and the inner through conducting portions 18 from each other. Accordingly, since the second through holes 10b are provided simultaneously with the formation of the second insulating layer 16, the manufacturing process can be simplified and cost can be reduced compared to those of the first embodiment. Furthermore, in an inorganic insulating layer formed by CVD, sufficient insulation properties can be ensured even if it is a thin film. Accordingly, even in the case where the diameters of the first through holes 10a of the silicon substrate 10 become smaller, two independent conductive paths (outer and inner through conducting portions 14c and 18) can be formed in the first through hole 10a with a high level of reliability.

What is claimed is:

1. A circuit substrate comprising:
a semiconductor substrate;
a first through hole provided in the semiconductor substrate;
a first insulating layer formed on both surfaces of the semiconductor substrate and on the inner surface of the first through hole;
a first wiring layer which is patterned and is a first ground layer, formed on each side of the semiconductor substrate, the first wiring layers being connected to each other via an outer through conducting portion formed on the inner surface of the first through hole;

a second insulating layer formed on the first wiring layers on both sides of the semiconductor substrate, and formed in the first through hole to cover the outer through conducting portion on the inner surface of the first through hole;

a second through hole formed in a portion of the second insulating layer in a central portion of the first through hole, and formed in a state in which an inner surface of the second trough hole becomes an identical single surface;

a via hole formed in the second insulating layer on the first wiring layer on each side of the semiconductor substrate; and a second wiring layer formed on the second insulating layer on each side of the semiconductor substrate, the second wiring layer including a signal layer and a second ground layer, the signal layer being connected to each other via an inner through conducting portion formed in the second through hole, and the second around layer being connected to the first wiring layer which is the first ground layer via the via hole.

2. The circuit substrate according to claim 1, wherein the semiconductor substrate is a silicon substrate having a thickness of 50 to 200 µm.

* * * * *